(12) United States Patent
Hayata et al.

(10) Patent No.: US 10,586,781 B2
(45) Date of Patent: Mar. 10, 2020

(54) BONDING APPARATUS AND METHOD OF ESTIMATING POSITION OF LANDING POINT OF BONDING TOOL

(71) Applicant: SHINKAWA LTD., Tokyo (JP)

(72) Inventors: Shigeru Hayata, Tokyo (JP); Hiroya Yuzawa, Tokyo (JP); Hiromi Tomiyama, Tokyo (JP)

(73) Assignee: SHINKAWA LTD., Tokyo (JP)

(*) Notice: Subject to any disclaimer, the term of this patent is extended or adjusted under 35 U.S.C. 154(b) by 233 days.

(21) Appl. No.: 15/373,982

(22) Filed: Dec. 9, 2016

(65) Prior Publication Data

US 2017/0154864 A1  Jun. 1, 2017

Related U.S. Application Data

(63) Continuation of application No. PCT/JP2015/066580, filed on Jun. 9, 2015.

(30) Foreign Application Priority Data

Jun. 10, 2014 (JP) .................. 2014-119519

(51) Int. Cl.
| | |
|---|---|
| H01L 21/28 | (2006.01) |
| H01L 23/00 | (2006.01) |
| H01L 21/52 | (2006.01) |
| H01L 21/67 | (2006.01) |
| B23K 1/00 | (2006.01) |
| B23K 3/08 | (2006.01) |
| B23K 101/40 | (2006.01) |

(52) U.S. Cl.
CPC ............ *H01L 24/75* (2013.01); *B23K 1/0016* (2013.01); *B23K 3/08* (2013.01); *H01L 21/52* (2013.01);
(Continued)

(58) Field of Classification Search
CPC . H01L 2924/00014; H01L 2224/45124; H01L 2224/45139; H01L 2224/45144;
(Continued)

(56) References Cited

U.S. PATENT DOCUMENTS 3,941,486 A * 3/1976 Tyler ...................... G01B 11/27
356/399
4,236,781 A * 12/1980 Arimura .............. G02B 21/082
348/131
(Continued)

FOREIGN PATENT DOCUMENTS

EP    1174908 A1    1/2002
JP    2001-249007 A    9/2001
(Continued)

OTHER PUBLICATIONS

International Search Report dated Aug. 11, 2015 from International Application No. PCT/JP2015/066580.

*Primary Examiner* — Erin B Saad
*Assistant Examiner* — Carlos J Gamino
(74) *Attorney, Agent, or Firm* — Katten Muchin Rosenman LLP

(57) ABSTRACT

A bonding apparatus 10 having a diagonal optical system 30, the bonding apparatus moves a capillary 24 down to a first heightwise position to calculate a position A11 of a tip end portion of the capillary 24 and a position A12 of a tip end portion of the capillary in an image on an imaging plane of the diagonal optical system 30, and similarly moves the capillary 24 down to a further lower second heightwise position to calculate a position A21 of the tip end portion of the capillary 24 and a position A22 of the tip end portion of the capillary in the image on the imaging plane. The bonding apparatus then estimates the position of the landing point of the capillary 24 on a bonding target 8 based on positional data for the four calculated positions A11, A12, A21, and A22, the first heightwise position, and the second heightwise position. With this, it is possible to use the diagonal optical system in the bonding apparatus to further improve positional accuracy in the bonding process.

6 Claims, 8 Drawing Sheets

(52) U.S. Cl.
CPC ........ *H01L 21/67138* (2013.01); *H01L 24/78* (2013.01); *H01L 24/85* (2013.01); *B23K 2101/40* (2018.08); *H01L 24/45* (2013.01); *H01L 2224/45124* (2013.01); *H01L 2224/45139* (2013.01); *H01L 2224/45144* (2013.01); *H01L 2224/45147* (2013.01); *H01L 2224/75753* (2013.01); *H01L 2224/75804* (2013.01); *H01L 2224/78301* (2013.01); *H01L 2224/78753* (2013.01); *H01L 2224/78804* (2013.01); *H01L 2224/859* (2013.01); *H01L 2224/85121* (2013.01); *H01L 2924/00014* (2013.01)

(58) Field of Classification Search
CPC . H01L 2224/45147; H01L 2224/05599; H01L 2224/45015; H01L 2924/207; H01L 21/52; H01L 21/67138; H01L 2224/75753; H01L 2224/75804; H01L 2224/78301; H01L 2224/78753; H01L 2224/78804; H01L 2224/85121; H01L 2224/859; H01L 24/45; H01L 24/75; H01L 24/78; H01L 24/85; H05K 2203/049
USPC ........ 228/101, 102, 103, 105, 1.1, 4.5, 7–10
See application file for complete search history.

(56) References Cited

U.S. PATENT DOCUMENTS

| | | | | |
|---|---|---|---|---|
| 4,452,526 A | * | 6/1984 | Johannsmeier | G03F 9/7069 355/43 |
| 4,671,446 A | * | 6/1987 | Sherman | H01L 21/67138 228/105 |
| 4,942,618 A | * | 7/1990 | Sumi | G01N 21/95684 382/154 |
| 5,199,628 A | * | 4/1993 | Homma | H01L 24/78 228/4.5 |
| 6,516,990 B2 | * | 2/2003 | Hess | B23K 20/005 228/105 |
| 8,091,762 B1 | * | 1/2012 | Cheng | B23K 20/004 228/102 |
| 2001/0011669 A1 | | 8/2001 | Hayata et al. | |
| 2001/0016062 A1 | * | 8/2001 | Enokido | B23K 20/004 382/152 |
| 2001/0042770 A1 | | 11/2001 | Hayata et al. | |
| 2003/0123866 A1 | * | 7/2003 | Hayata | G03B 17/00 396/80 |
| 2005/0094865 A1 | * | 5/2005 | Cheng | G01B 11/026 382/146 |
| 2010/0110400 A1 | * | 5/2010 | Sato | G03B 27/42 355/53 |
| 2010/0301101 A1 | * | 12/2010 | Seyama | H01L 24/78 228/105 |
| 2013/0009328 A1 | * | 1/2013 | Wang | H01L 23/544 257/797 |
| 2013/0250298 A1 | * | 9/2013 | Komuta | G01B 11/272 356/400 |
| 2017/0148759 A1 | * | 5/2017 | Hayata | H01L 21/52 |
| 2017/0291251 A1 | * | 10/2017 | Hayata | B23K 20/005 |
| 2018/0090464 A1 | * | 3/2018 | Hayata | B23K 1/06 |
| 2018/0114767 A1 | * | 4/2018 | Wasserman | H01L 23/544 |

FOREIGN PATENT DOCUMENTS

| | | |
|---|---|---|
| JP | 2002-076050 A | 3/2002 |
| JP | 3416091 | 6/2003 |

* cited by examiner

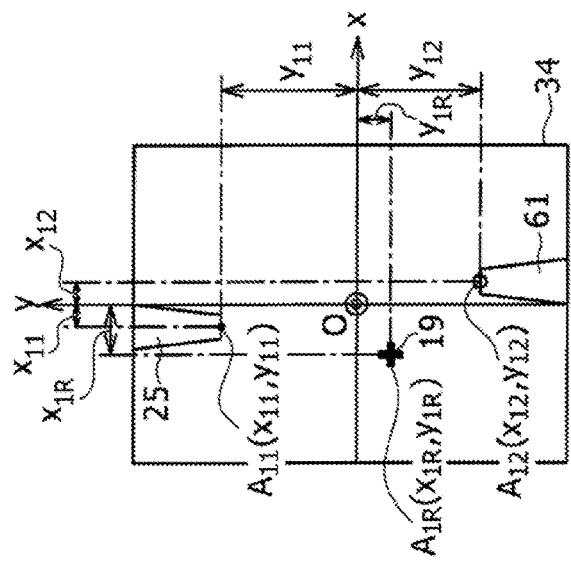
FIG. 4B
FIG. 4C
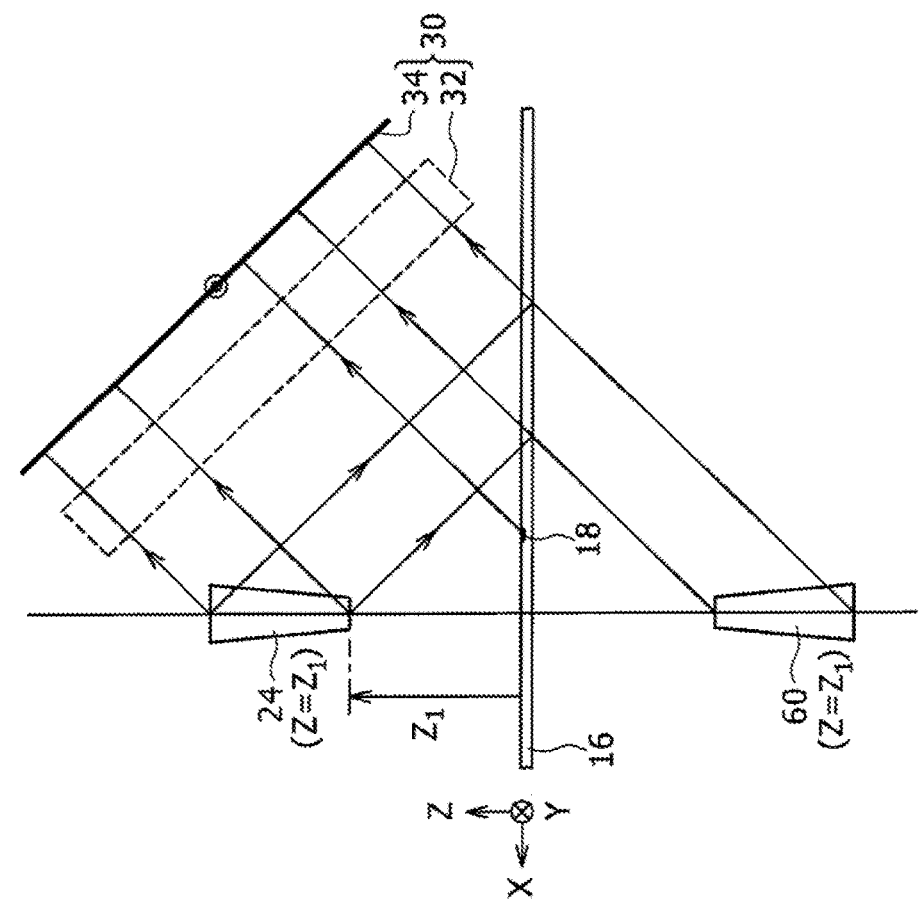
FIG. 4A

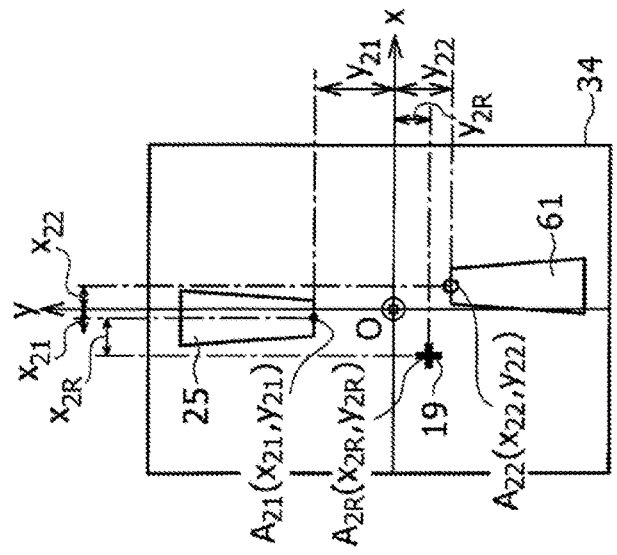
FIG. 5B
FIG. 5C
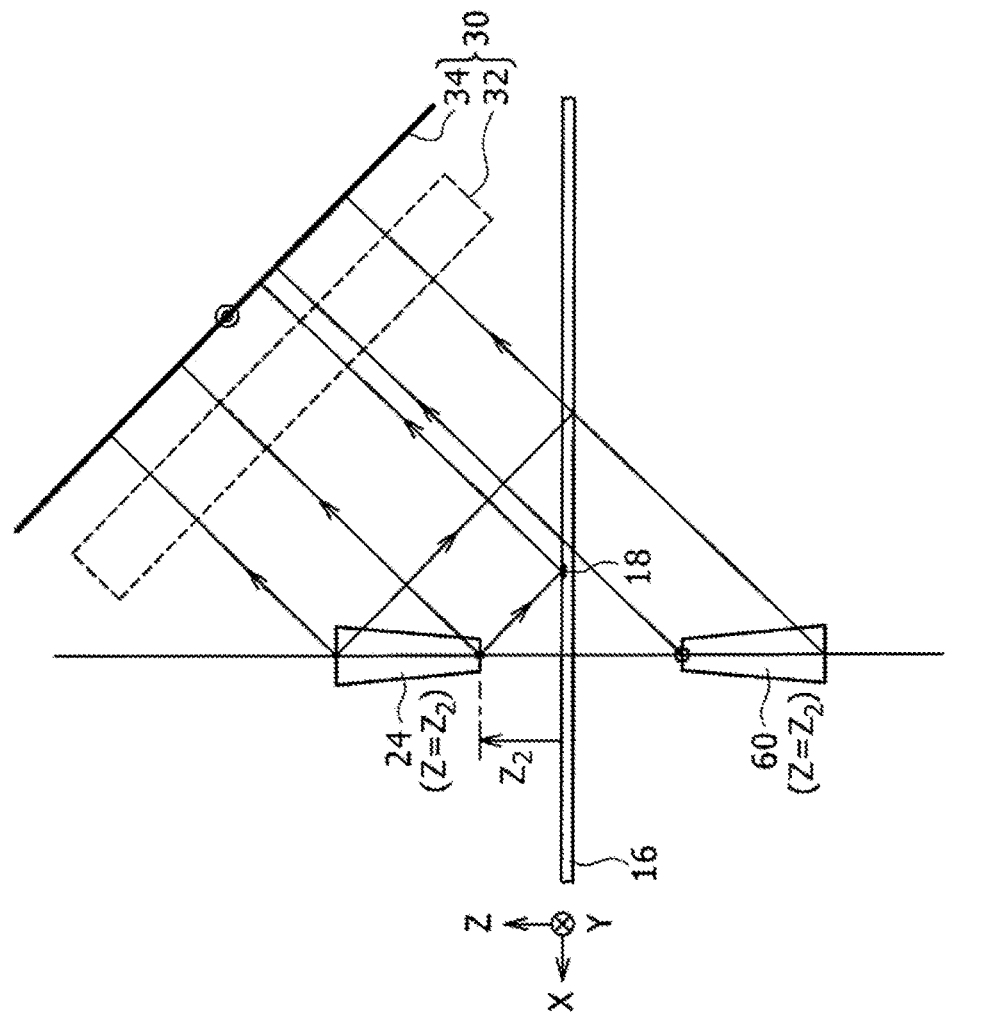
FIG. 5A

HEIGHTWISE POSITION Z OF TOOL TIP END PORTION

BONDING APPARATUS AND METHOD OF ESTIMATING POSITION OF LANDING POINT OF BONDING TOOL

TECHNICAL FIELD

The present invention relates to a bonding apparatus and a method of estimating a position of a landing point of a bonding tool. In particular, the present invention relates to a bonding apparatus having a bonding tool and a positioning camera that are disposed with a predetermined offset distance therebetween, and a method of estimating a position of a landing point of this bonding tool.

BACKGROUND ART

In a wire bonding process, for example, in order to bond a wire to a desired position on a bonding target, it is necessary to perform correct positioning of a position of a tip end of a tool holding the wire to the desired position on the bonding target. Although a positioning camera is provided for this purpose, it is not possible to provide the positioning camera at the same position as the bonding tool. Therefore, the bonding tool and the positioning camera are provided with a predetermined offset distance therebetween, positioning is performed between the positioning camera and the desired position on the bonding target, and then the bonding tool is moved by the offset distance.

PTL 1 discloses use of a light source, a reference member, and an optical system such as a prism in order to correctly calibrate an offset amount between a shaft center of a tool of a bonding apparatus and an optical axis of a position detection camera provided separately from the tool. Here, a stick-shaped reference member and a tool tip end are irradiated with light using the light source, shadows of the reference member and the tool tip end are detected by the optical system using a position detection camera, and an offset amount is correctly calibrated based on displacement between the shadows.

PTL 2 discloses a wire connecting apparatus having a diagonal optical system of a configuration in which immediately before a capillary performs pressurization, a connecting area is irradiated with light from an obliquely upward position at a predetermined angle with respect to a direction in which the capillary extends, and an image of the connecting area is taken using a camera provided symmetrically obliquely with the capillary interposed therebetween, instead of a camera taking an image of a connecting area from a vertically upward position. Here, a two-dimensional coordinate of an ideal pressurizing point of the connecting area is specified by the camera, movement of the capillary is stopped when the capillary moves at a searching height, a portion of a tip end of the capillary at this time and its shadow are captured using the camera of the diagonal optical system, a two-dimensional coordinate of a predicted pressurizing point is obtained to obtain a difference between the two-dimensional coordinate of the predicted pressurizing point and the two-dimensional coordinate of the ideal pressurizing point, and thus the movement of the capillary is corrected.

CITATION LIST

Patent Literature

PTL 1: Japanese Patent No. 3416091
PTL 2: Japanese Unexamined Patent Application Publication No. 2002-076050

SUMMARY OF INVENTION

Technical Problems

The method disclosed in PTL 1 in which the offset amount is configured using the reference results in an increased cost, as a complicated optical system including a lighting unit is used, and has a problem in heat resistance or the like. Although the configuration may be simplified if the reference is observed by the diagonal optical system according to PTL 2, the diagonal optical system recognizes a change in a height of the object as a positional displacement. While a relation between a height of the object and a height of the tool tip end may be previously set, the relation between the height of the object and the tool tip end or an inclination angle of the diagonal optical system changes due to temperature change or the like, and it is difficult to detect the position correctly as it is.

An object of the present invention is to provide a bonding apparatus capable of improving positional accuracy in a bonding process using a diagonal optical system, and a method of estimating a position of a landing point of a bonding tool.

Solution to Problems

A bonding apparatus according to the present invention includes: a bonding tool attached to a bonding head; a stage configured to move the bonding head slidably in an XY direction; a Z-movement mechanism configured to move the bonding tool freely in a Z direction perpendicular to an XY plane; a planar body disposed under the bonding tool and configured to receive an image relating to the bonding tool; a diagonal optical system configured to observe the bonding tool and the planar body from an obliquely upward position; and a control unit configured to execute a process for estimating a position of a landing point of the bonding tool, wherein the control unit is configured to execute the steps of: moving the bonding tool down along the Z direction to a predetermined first heightwise position within a range in which the bonding tool remains in contactless with the planar body; taking an image, at the first heightwise position, of a tip end portion of the bonding tool and a tip end portion of the bonding tool in the image received on the planar body using the diagonal optical system, and calculating a position A11 and a position A12 on an imaging plane, the position A11 being a position of the tip end portion of the bonding tool, the position A12 being a position of the tip end portion of the bonding tool in the image; moving the bonding tool down to a second heightwise position within the range in which the bonding tool remains in contactless with the planar body, the second heightwise position being lower than the first heightwise position; taking an image, at the second heightwise position, of a tip end portion of the bonding tool and a tip end portion of the bonding tool in the image received on the planar body using the diagonal optical system, and calculating a position A21 and a position A22 on the imaging plane, the position A21 being a position of the tip end portion of the bonding tool, the position A22 being a position of the tip end portion of the bonding tool in the image; and estimating the position of the landing point of the bonding tool on a bonding target based on positional data for the four calculated positions A11, A12, A21, and A22, the first heightwise position, and the second heightwise position.

In the bonding apparatus according to the present invention, it is preferable that the planar body is a mirror, and the image relating to the bonding tool received on the mirror is a virtual image of the bonding tool reflected on the mirror.

In the bonding apparatus according to the present invention, it is also preferable that the planar body is the bonding target having a pattern on a surface in a mirror or diffusing plane.

It is also preferable that the bonding apparatus according to the present invention further includes: a lighting apparatus disposed on a side opposite of the diagonal optical system with the bonding tool interposed therebetween, and configured to emit light obliquely downward, and that the planar body is a planar plate that receives an image of a shadow of the bonding tool to which light is emitted from the lighting apparatus, and the diagonal optical system takes an image of the tip end portion of the bonding tool and a tip end portion of the bonding tool in the image of the shadow received on the planar body.

In the bonding apparatus according to the present invention, it is also preferable that the bonding tool is one of a capillary that performs a wire bonding process, a tool that performs a die bonding process, and a tool that performs a flip-chip mounting process.

In the bonding apparatus according to the present invention, it is also preferable that the diagonal optical system includes a prior-stage optical system having a lens and a projection plane and satisfying a Scheimpflug condition for the bonding tool and the planar body, and takes an image on the projection plane of the prior-stage optical system using a telecentric optical system.

In the bonding apparatus according to the present invention, it is also preferable that the diagonal optical system employs an optical length adaptive optical device that adjusts an optical length of one of the tip end portion of the bonding tool and the tip end portion of the bonding tool in the image received on the planar body so that the optical length becomes identical with an optical length of the other.

It is also preferable that the bonding apparatus according to the present invention further includes: a positioning camera attached to the bonding head with a predetermined offset distance from the bonding tool, and that the planar body has a reference pattern that provides a reference for positioning, and the control unit detects a position of the reference pattern on the planar body using the positioning camera, and moves the bonding tool from the detected position of the reference pattern by the predetermined offset distance.

In the bonding apparatus according to the present invention, it is also preferable that the control unit detects a change in a bonding offset generated during bonding based on a difference between the position of the reference pattern and the estimated position of the landing point.

In the bonding apparatus according to the present invention, it is also preferable that the control unit performs bonding by feeding back an amount of the detected change in the bonding offset.

In the bonding apparatus according to the present invention, it is also preferable that a pattern on a semiconductor device to which bonding is performed is used as the reference pattern for positioning in place of a reference pattern on the planar body.

A method of estimating a position of a landing point of a bonding tool according to the present invention includes the steps of: preparing a bonding apparatus including: a bonding tool attached to a bonding head; a stage configured to move the bonding head slidably in an XY direction; a Z-movement mechanism configured to move the bonding tool freely in a Z direction perpendicular to an XY plane; a planar body disposed under the bonding tool and configured to receive an image relating to the bonding tool; a diagonal optical system configured to observe the bonding tool and the planar body from an obliquely upward position; and a control unit configured to execute a process for estimating a position of a landing point of the bonding tool; the control unit includes: moving the bonding tool down along the Z direction to a predetermined first heightwise position within a range in which the bonding tool remains in contactless with the planar body; taking an image, at the first heightwise position, of a tip end portion of the bonding tool and a tip end portion of the bonding tool in the image received on the planar body using a camera provided for the diagonal optical system, and calculating a position A11 and a position A12 on an imaging plane, the position A11 being a position of the tip end portion of the bonding tool, the position A12 being a position of the tip end portion of the bonding tool in the image; causing the control unit to move the bonding tool down to a second heightwise position within the range in which the bonding tool remains in contactless with the planar body, the second heightwise position being lower than the first heightwise position; taking an image, at the second heightwise position, of a tip end portion of the bonding tool and a tip end portion of the bonding tool in the image received on the planar body using the camera provided for the diagonal optical system, and causing the control unit to calculate a position A21 and a position A22 on the imaging plane, the position A21 being a position of the tip end portion of the bonding tool, the position A22 being a position of the tip end portion of the bonding tool in the image; and estimating the position of the landing point of the bonding tool on a bonding target based on positional data for the four calculated positions A11, A12, A21, and A22, the first heightwise position, and the second heightwise position.

Advantageous Effect of Invention

According to the above configuration, an image or a shadow of the tip end portion of the bonding tool is projected on the planar body, and an image of the image or the shadow and the tip end portion of the actual bonding tool at the same time is taken using the diagonal optical system. When the bonding tool makes landing on the bonding target, on the imaging plane, the position of the tip end portion of the bonding tool in the image or the shadow relating to the bonding tool and the position of the tip end portion of the actual bonding tool should match.

As the position of the tool tip end changes from a set value due to temperature change or the like, an exact position on the bonding target at which the bonding tool makes landing is not known. Therefore, if a coordinate of the landing point can be estimated without having the bonding tool make landing on the bonding target, it is possible to perform a bonding process based on the estimated coordinate of the landing point, thus to improve positional accuracy in the bonding process.

In the above configuration, for each of two heightwise positions at which the bonding tool does not make landing on the object, the position of the image or the shadow of the tip end portion of the bonding tool and the position of the tip end portion of the actual bonding tool are calculated, and the coordinate of the landing point may be estimated based on positional data for the total four positions. With this, it is possible to further improve positional accuracy in the bonding process.

BRIEF DESCRIPTION OF DRAWINGS

FIGS. 1a and 1b show diagrams illustrating a configuration of a bonding apparatus of an embodiment according to the present invention, wherein FIG. 1a is a diagram showing a state when a bonding process is performed, and FIG. 1b is a diagram showing a state when estimation of a landing point of a capillary is performed.

FIGS. 4a, 4b, 4c show diagrams showing a procedure, at first height, of obtaining a position of a tip end portion of a capillary on an imaging plane, and a position of a tip end portion of a capillary in a virtual image on a mirror in the procedures shown in FIG. 3, wherein FIG. 4a is a diagram showing a relation between optical paths when an image of the capillary and its virtual image is taken, FIG. 4b is a diagram showing an imaging plane, and FIG. 4c is a diagram showing the position of the tip end portion of the capillary on the imaging plane and the position of the tip end portion of the capillary in the virtual image associated with height of the tip end of the bonding tool.

FIGS. 5a, 5b, 5c show diagrams similar to FIGS. 4a, 4b, 4c, showing a procedure for a second height in the procedures shown in FIG. 3.

DESCRIPTION OF EMBODIMENT

Figure 1A:
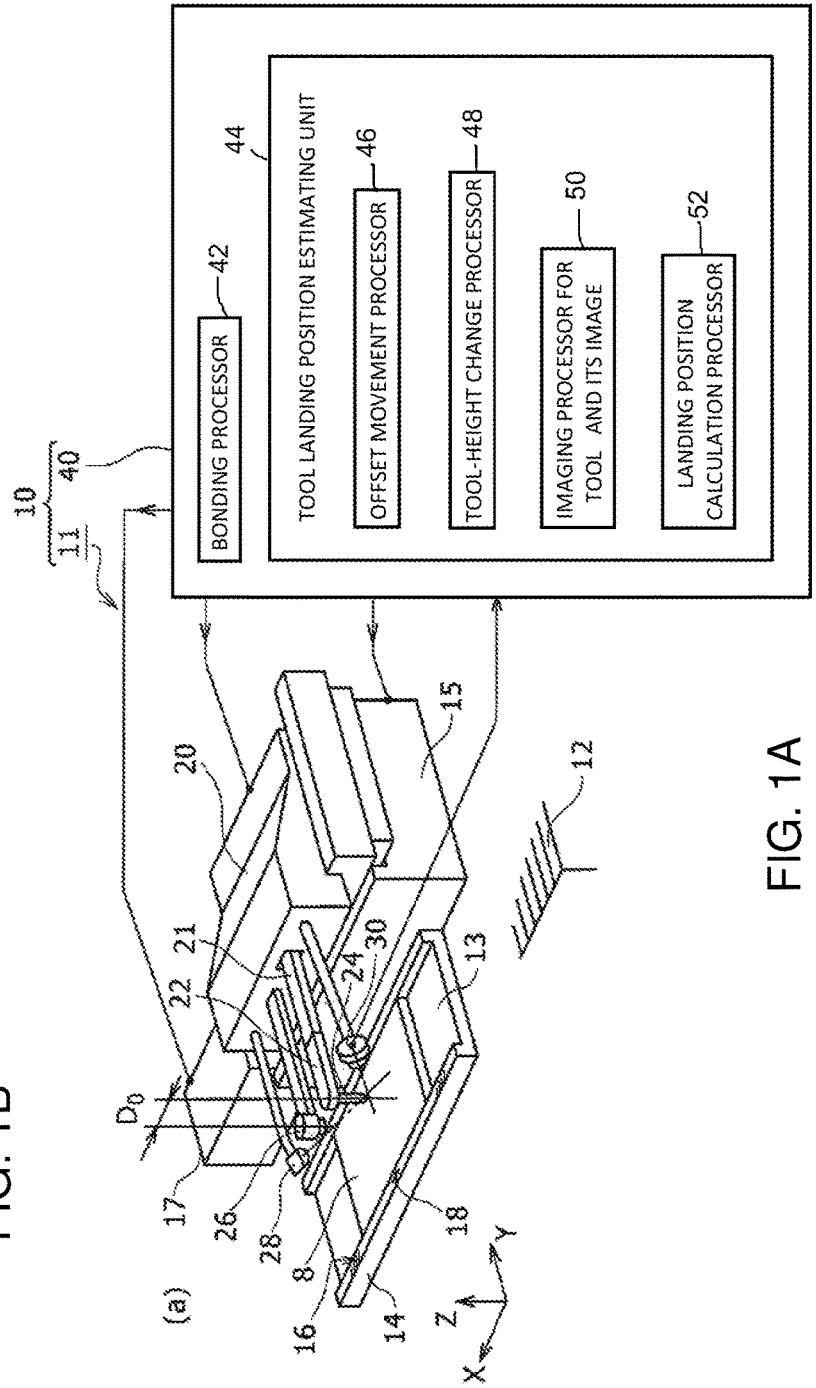

Hereinafter, an embodiment according to the present invention will be described in detail with reference to the drawings. Examples of a bonding apparatus include an apparatus performing a bonding process using a bonding tool such as a wire bonding apparatus, a die bonding apparatus, and a flip-chip mounting apparatus. In the following, a description is given taking a wire bonding apparatus using a capillary as a bonding tool unless otherwise stated.

Hereinafter, like components are denoted by like reference numbers throughout the drawing, and will not be described repeatedly.

FIG. 1a is a configurational diagram of a wire the bonding apparatus 10. The wire bonding apparatus 10 is configured by an apparatus main body 11 including a capillary 24 and a diagonal optical system 30, and a control unit 40 that controls components that constitute the apparatus main body 11 as a whole. The components that constitute the apparatus main body 11 are disposed on a mounting table 12. In the following, the wire bonding apparatus 10 is referred to the bonding apparatus 10 unless otherwise stated. Further, FIG. 1a shows a bonding target 8 although this is not a component of the wire bonding apparatus 10.

Figure 1B:
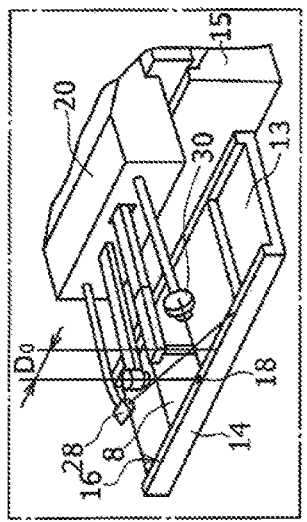

The bonding apparatus 10 performs a normal bonding process using the capillary 24, and estimates a position of a landing point of the capillary 24 on the bonding target 8 using the diagonal optical system 30. FIG. 1a shows the bonding apparatus 10 in a state in which the normal bonding process is performed, and FIG. 1b shows a state of the bonding apparatus 10 when estimation of the position of the landing point of the capillary 24 on the bonding target 8 is performed. In the following, the "estimation of the position of the landing point of the capillary 24 on the bonding target" is simply referred to as "estimation of the position of the landing point". While a three-dimensional position may be estimated in the estimation of the position of the landing point, the following describes estimation of a position within an XY plane unless otherwise stated. FIG. 1a shows X direction, Y direction, and Z direction in a three-dimensional coordinate system. The XY plane is a plane parallel with a top surface of the mounting table 12. The Z direction is a direction perpendicular to the XY plane.

It should be noted that a perpendicular xy coordinate system is used in order to indicate a planar position on an imaging plane in the diagonal optical system 30. In the xy coordinate system, x direction and y direction are different from the X direction and the Y direction in FIG. 1a. In order to distinguish the respective two directions, uppercase letters X and Y are used for the coordinate system of a plane parallel with the top surface of the mounting table 12, and lowercase letters x and y are used for the coordinate system of the imaging plane of the diagonal optical system 30. Conversion between the (X, Y) coordinate system and the (x, y) coordinate system may be performed based on a geometric arrangement between the top surface of the mounting table 12 and the imaging plane of the diagonal optical system 30.

In the following description, a focus is placed on a function of the estimation of the position of the landing point of the capillary 24 on the bonding target 8, and the normal bonding process will be described to the necessary extent.

A bonding stage 13 is a bonding target holding stage on which the bonding target 8 is placed, and a bonding target is transferred from a loader by a feeding pawl of a feeder that is not illustrated. The bonding target 8 is a substrate on which a semiconductor device is mounted, for example. In this case, a pad of the semiconductor device and a lead of the substrate are targets of bonding in the actual wire bonding process. In this case, the landing point in the estimation of the position of the landing point is either a point at which a tip end portion of the capillary 24 lands on a surface of the pad of the semiconductor device, or a point at which the tip end portion of the capillary 24 lands on a surface of the lead of the substrate. In the following description, the point at which the tip end portion of the capillary 24 lands on the surface of the semiconductor pad is taken as the landing point.

In FIG. 1*b*, in order to estimate the position of the landing point, a mirror 16 is mounted in place of the bonding target 8 on the bonding stage 13. The mirror 16 is mounted on the bonding stage 13 at an end portion at which interference with the bonding target 8 does not occur, position in the Z direction of its top surface as a mirror plane is set to be the same as a position in the Z direction of a top surface of a semiconductor pad on the bonding target 8. FIG. 1*b* shows an example in which the mirror 16 is mounted on a transfer rail 14. The mirror 16 may be a reflective plate.

A reference mark 18 engraved in the top surface of the mirror 16 is a reference pattern used as a positional reference in the bonding process, and a cross pattern is used in the example of FIG. 1*b*. Any pattern other than the cross pattern may be used as long as the pattern is suited for positioning. For example, a double-circle pattern may be employed. As a virtual image of the capillary 24 is reflected on the mirror 16, an image of the actual capillary 24, a virtual image of the capillary 24, and the reference mark 18 may be taken at the same time by using the diagonal optical system 30.

When the bonding target 8 is mounted or discharged, the bonding target 8 is transferred to the bonding stage 13 on the mounting table 12. In the wire bonding process, the capillary 24 faces toward the bonding target 8 as illustrated in FIG. 1*a*. During the wire bonding process, the bonding stage 13 is in a fixed state to the mounting table 12. By contrast, during the estimation of the position of the landing point, the capillary 24 faces the mirror 16 on the transfer rail 14 as illustrated in FIG. 1*b*. While the estimation of the position of the landing point is performed, the bonding stage 13 provided with the transfer rail 14 is in a fixed state to the mounting table 12.

As the bonding stage 13, a movable table made of metal may be used. Here, a direction in which the bonding stage 13 moves with respect to the mounting table 12 is the X direction. the bonding stage 13 is connected to a reference potential such as a ground potential of the bonding apparatus 10. If insulation from the bonding target is required, an insulating process is performed to a required portion of the bonding stage 13.

An XY stage 15 is a moving stage having a bonding head 20, for moving the bonding head 20 to a desired position within the XY plane with respect to the mounting table 12 and the bonding stage 13. The XY stage 15 is driven and moved by a linear motor 17 under control of the control unit 40.

The bonding head 20 is a movement mechanism that is mounted and fixed to the XY stage 15 and includes a Z motor, and rotation control of which causes the capillary 24 to move in the Z direction perpendicular to the XY plane by a bonding arm 21 and a transducer 22. As the Z motor, a linear motor may be used.

As described above, the XY stage 15 and the bonding head 20 are a movement mechanism unit for driving the capillary 24 to move to a predetermined position with respect to the bonding stage 13 in the X direction, the Y direction, and the Z direction according to predetermined procedure.

The bonding arm 21 is a member to which the transducer 22 is attached, and that may be rotated by rotation control of the Z motor about a rotational center provided for the bonding head 20.

The transducer 22 is an elongated stick member attached to the bonding arm 21 at its base portion, and to the capillary 24 at its tip end portion. The transducer 22 includes an ultrasonic transducer attached thereto, and transmits ultrasonic energy generated by driving the ultrasonic transducer as bonding energy to the capillary 24. The transducer 22 is configured in a horn shape tapered toward a tip end side so that the ultrasonic energy from the ultrasonic transducer may be efficiently transmitted to the capillary 24. As the ultrasonic transducer, a piezoelectric device is used.

The capillary 24 is a bonding tool that is in a circular cone shape whose tip end surface is flat, and has a center hole through which a bonding wire that is not illustrated may be inserted along a longitudinal direction. The capillary 24 may be made of ceramic which is an insulating body.

While not illustrated, the bonding wire is a thin wire made of gold, silver, copper, aluminum, or the like.

The positioning camera 26 is a camera used for positioning so that the position of the tip end portion of the capillary 24 comes immediately above a position of the pad of the semiconductor device as a target of the bonding process. Here, the positioning is performed by driving the XY stage 15 to move by the linear motor 17 under control of the control unit 40 so that a coordinate center of the positioning camera 26 comes immediately above the reference mark 18.

The positioning camera 26 is provided distant from the capillary 24 by a predetermined offset interval D0 in +X direction and attached to the bonding head 20 similarly to the capillary 24. Therefore, if the coordinate center of the positioning camera 26 is positioned at a coordinate center of the reference mark 18, the tip end position of the capillary 24 comes immediately above the reference mark 18 by moving the bonding head 20 from this position by D0 in +X direction. Therefore, the tip end portion of the capillary 24 comes right at a position of a desired pad by performing positioning so that the coordinate center of the positioning camera 26 comes to the position of the desired pad of the semiconductor device, driving the bonding arm 21 to move by the linear motor 17 in this state by D0 in +X direction, and moving the capillary 24 down in −Z direction at this position. Performing the bonding process at this position allows bonding of the bonding wire to the desired pad.

A lighting apparatus 28 is an apparatus that employs a LED (Light Emitting Diode) or the like and emits light to a bonding target from an obliquely upward position of the capillary 24. When the mirror 16 is used to estimate the position of the landing point, the light is turned off. In a different embodiment, if a diffuser plate 62 (cf. FIG. 7) is used in place of the mirror 16, the lighting apparatus 28 is turned on to irradiate the capillary 24 from its side, and a shadow of the capillary 24 is projected on a top surface of the diffuser plate 62.

While attached to the bonding head 20, the lighting apparatus 28 may be provided separately from the bonding head 20 in some cases. An inclination angle of a lighting direction of the lighting apparatus 28 with respect to the longitudinal direction of the capillary 24 is preferably, but not necessarily, the same as an inclination angle of an optical axis of the diagonal optical system 30 with respect to the longitudinal direction of the capillary 24.

The diagonal optical system 30 is an optical system that is disposed on a side opposite of the lighting apparatus 28 with the capillary 24 interposed therebetween, and observes the capillary 24 and the mirror 16 from an obliquely upward position. The diagonal optical system 30 is attached to the bonding head 20, but may be provided separately from the bonding head 20 in some cases.

Figure 2:
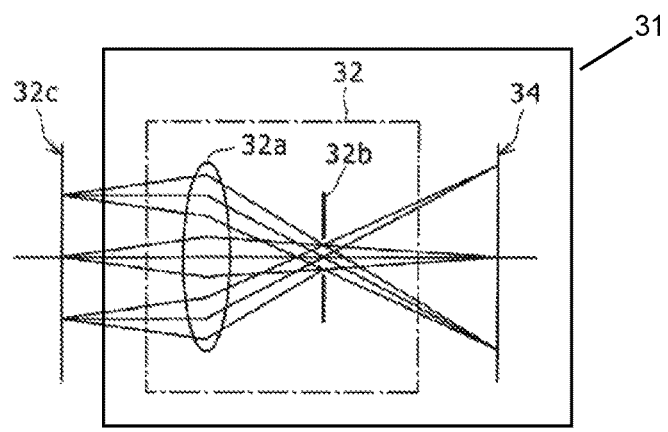
FIG. 2 is a diagram illustrating a telecentric optical system used in the embodiment according to the present invention.
Figure 6:
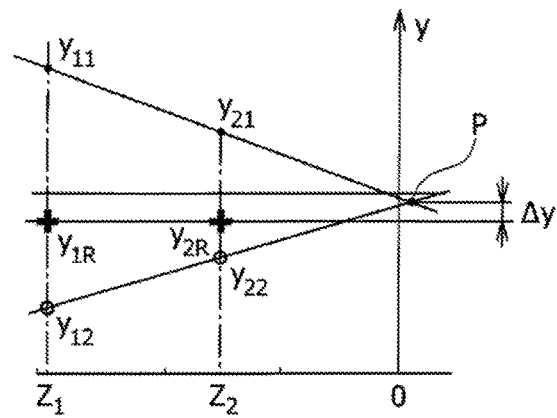
FIG. 6 is a diagram for estimation and calculation of the position of the landing point of the capillary on the bonding target in the bonding apparatus of the embodiment according to the present invention.

The diagonal optical system 30 includes an imaging camera 31 having a telecentric optical system 32 and an imaging plane 34 (cf. FIGS. 4, 5, and 6). FIG. 2 is a diagram illustrating the telecentric optical system 32. The telecentric optical system 32 is an optical system configured such that a diaphragm 32b is disposed at a rear focal length position of a lens 32a, and an optical axis and key light are assumed to be parallel with each other on an object plane 32c. The telecentric optical system 32 has its key light parallel with the optical axis, and therefore a ratio is constant even if the position of the object is displaced in a direction along the optical axis.

The imaging camera 31 included in the diagonal optical system 30 is an imaging apparatus that projects the tip end portion of the capillary 24 and a virtual image of the capillary 24 reflected on the mirror 16 on the imaging plane 34 using the telecentric optical system 32, and transmits image data of the image to the control unit 40 via an appropriate signal line. As the imaging camera 31, a two-dimensional CCD imaging apparatus is used.

Referring back to FIG. 1a, the control unit 40 controls the components that constitute the apparatus main body 11 as a whole. The control unit 40 may be configured by a suitable computer. The control unit 40 includes a bonding processor 42 that executes the bonding process. The control unit 40 further includes a tool landing position estimating unit 44 that executes the estimation of the position of the landing point. The tool landing position estimating unit 44 includes an offset movement processor 46, a tool-height change processor 48, an imaging processor 50 for tool and its image, and a landing position calculation processor 52.

These functions may be realized by executing software on the bonding apparatus 10. Specifically, these functions may be realized by executing the bonding program. A part of these functions may be realized in hardware manner.

Figure 3:
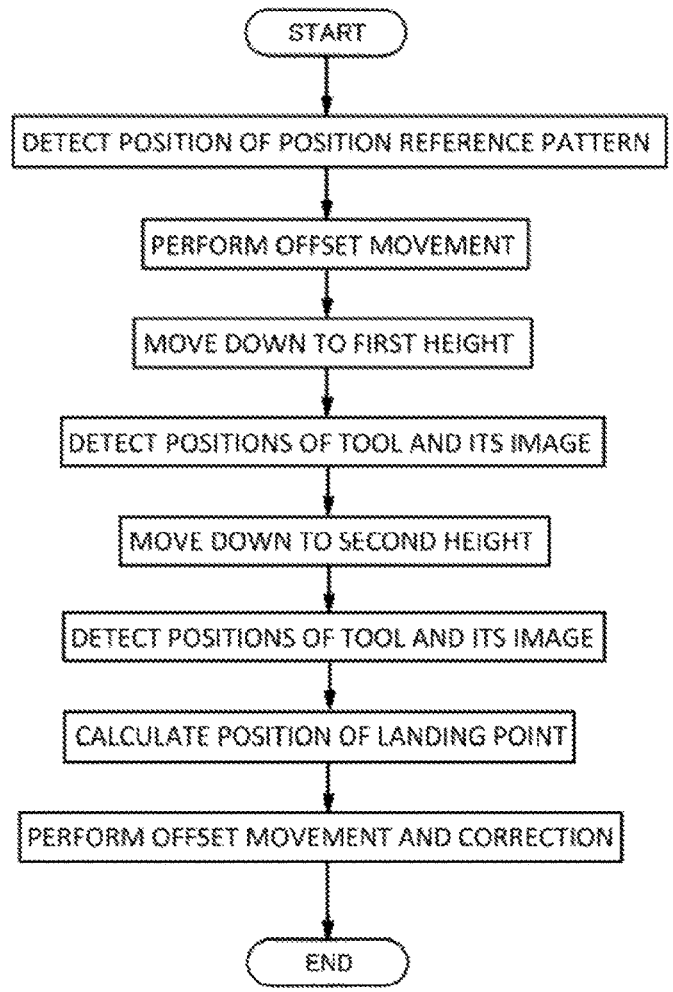
FIG. 3 is a flowchart showing procedures of the bonding apparatus illustrated in FIGS. 1a and 1b, for estimating a position of the landing point of the capillary on a bonding target.

Actions of the bonding apparatus 10, in particular, functions of the control unit 40 will be described in further detail with reference to FIG. 3 through FIG. 6. FIG. 3 is a flowchart showing processing procedures, in the bonding apparatus 10, for estimating the position of the landing point. FIG. 4 and FIGS. 5a, 5b, 5c are diagrams showing contents of the processing procedures in FIG. 3. The processing procedures in FIG. 3 are executed by the tool landing position estimating unit 44 of the control unit 40.

In the bonding apparatus 10, the offset interval D0 between the capillary 24 and the positioning camera 26 is calibrated before performing the bonding process. For this purpose, the bonding head 20 is driven and moved in −X direction to move the positioning camera 26 to a position immediately above the mirror 16. Then, detection of the position of the reference mark 18 as the position reference pattern engraved in the mirror 16 is performed by the positioning camera 26 (S10). Specifically, positioning is performed so that a cross pattern intersection in the reference mark 18 is taken as a coordinate center, and a center mark as the coordinate center in a view field of the positioning camera 26 is aligned with the cross pattern intersection while driving the XY stage 15 to be moved by the linear motor 17. Further, instead of aligning to the center of the view field, a position of the reference mark 18 within the view field may be detected by image processing to take this position as a reference.

Next, the bonding head 20 is moved by an offset of a predetermined distance (S12). Here, when the position of the reference mark 18 detected in the image processing is taken as the reference, the bonding head 20 is moved by an offset taking this position as the reference. The processing procedure is executed by a function of the offset movement processor 46 of the control unit 40. Specifically, the bonding head 20 is driven and moved in +X direction by the offset interval D0. With this, the capillary 24 is moved to the position immediately above the reference mark 18.

The procedure hereinafter is a procedure for estimating the position of the landing point. Specifically, while moving the capillary 24 downward should bring its tip end portion right at the reference mark 18 by performing S12, the actual position of the landing point is not the position of the reference mark 18 in some cases. Conceivable reasons of this include a set value of the offset interval D0 being not correct, a direction of the downward movement of the capillary 24 being not parallel with the optical axis of the positioning camera 26, and a possible temperature change. The estimation of the position of the landing point is performed by moving the capillary 24 downward, and calculating a position at which its tip end portion is brought into contact with the surface of the mirror 16 as a landing point. The following describes the procedure for the estimation of the position of the landing point without having the capillary 24 actually make landing.

Thus, the capillary 24 is moved downward to a predetermined first height Z1 (S14). This process is executed by a function of the tool-height change processor 48 of the control unit 40. Specifically, by driving the Z motor provided within the bonding head 20, the bonding arm 21 is rotated so that the capillary 24 moves downward. As an amount of movement of the Z motor is measured by an encoder, a value measured by the encoder is converted into a heightwise position Z of the capillary 24, and the capillary 24 is moved down to and stopped at a heightwise position within a range in which the capillary 24 is not brought into contact with the mirror 16. The heightwise position Z in this state is a first heightwise position Z1.

The first heightwise position Z1 may be set to a predetermined heightwise position within the range in which the capillary 24 is not brought into contact with the mirror 16. For example, a position at a searching height used in the wire bonding process may be set as the first heightwise position Z1. When the capillary 24 is moved from a position of a first bonding point to a position of a second bonding point in the wire bonding process, the capillary 24 is first moved down at high speed, and then the speed is switched to a low speed as the capillary 24 reaches a predetermined height immediately above the second bonding point. This position of the height is a position of the searching height. The position of the searching height is previously set according to specification of the bonding apparatus 10. For example, the searching height position is set in a range of hundreds μm from a surface of a bonding target.

Next, calculation of the positions of the capillary 24 as the bonding tool and its image is performed (S16). The processing procedure is executed by a function of the imaging processor 50 for tool and its image of the control unit 40. The position of the capillary 24 and the position of its virtual image are the positions in the two-dimensional xy coordinate system on the imaging plane 34 shown by taking an image of the capillary 24 and its virtual image by an imaging camera 31 provided for the diagonal optical system 30. Here, assuming that the two-dimensional coordinate on the imaged plane is (x, y), a relation between the two-dimensional coordinate (x, y) and the two-dimensional coordinate (X, Y) on the XY stage 15 in FIG. 1a may be converted using a conversion equation or the like.

FIGS. 4a, 4b, 4c shows diagrams showing a procedure of calculation of the positions of the capillary 24 and its image at the first heightwise position Z1. FIG. 4a is a diagram showing a relation between optical paths when an image of the capillary 24 and a virtual image 60 of the capillary 24 reflected on the mirror 16 is taken in an XZ plane including the capillary 24 in the three-dimensional XYZ coordinate system of the XY stage 15.

The first heightwise position Z1 is a value calculated based on a value of the encoder provided for the Z motor, and not necessarily based on a heightwise position of the top surface of the mirror 16. However, in FIGS. 4*a*, 4*b*, 4*c*, the first height Z1 is shown taking the heightwise position of the top surface of the mirror 16 as a reference.

The mirror 16 is a member configured such that a reflective material is applied to a back surface of a glass plate, and the glass back surface to which the reflective material is applied constitutes a reflecting surface. When the reflecting surface is seen obliquely, the virtual image 60 of the capillary 24 is shown virtually on the back side of the reflecting surface opposite to the side on which the capillary 24 is present.

When an image of the capillary 24 and the mirror 16 is taken using the imaging camera 31 provided for the diagonal optical system 30, light from the capillary 24 is shown as it is on the imaging plane 34 of the imaging camera 31 via the telecentric optical system 32. Similarly, light from the reference mark 18 is shown as it is on the imaging plane 34 via the telecentric optical system 32. Further, the light from the capillary 24 reflected on the mirror 16 is shown on the imaging plane 34 via the telecentric optical system 32 as if the light is light from the virtual image 60 of the capillary 24. Here, in the figure, an influence of a refractive index of the glass plate of the mirror 16 is not shown.

FIG. 4*b* is a diagram showing a plane representing the imaging plane 34 of the diagonal optical system 30 illustrated in FIG. 4*a*. The lower-case xy coordinate system is used as a coordinate system for the imaging plane 34, and an x axis and a y axis that are perpendicular to each other are shown, where an intersection between the x axis and the y axis is indicated by a double circle. The intersection is the origin O of the xy coordinate system. FIG. 4*b* shows a capillary 25, a reference mark 19, and a capillary virtual image 61 that are shown on the imaging plane 34. The capillary 25, the reference mark 19, and the capillary virtual image 61 shown on the imaging plane 34 are denoted by different reference numbers in order to distinguish from the capillary 24, the reference mark 18, and the virtual image 60 of the capillary before passing through the diagonal optical system 30.

Each position of these predetermined points on the imaging plane 34 is represented in the xy coordinate system in such a manner that its x position is indicated by a distance from the origin O along the x axis and its y position is indicated by a distance from the origin O along the y axis. Therefore, the position of the corresponding predetermined point is calculated as a two-dimensional coordinate A (x, y). FIG. 4*b* shows a position A11(x11, y11) of a tip end portion of the capillary 25, a position A12(x12, y12) of a tip end portion of the capillary in the virtual image 61, and a position A1R(x1R, y1R) of a tip end portion of the reference mark 19 that are thus calculated. In this manner, the position A11(x11, y11) of the tip end portion of the capillary 25, the position A12(x12, y12) of the capillary tip end portion in the virtual image 61, and the position A1R(x1R, y1R) of the reference mark 19 may be calculated on the imaging plane 34.

FIG. 4*c* shows the diagram showing the y positions along a vertical axis and the heightwise position Z of the tip end portion of the capillary 24 along a horizontal axis in the two-dimensional coordinates thus calculated. Here, the y position of the tip end portion of the capillary 25=y11, the y position of the tip end portion of the capillary in the virtual image 61=y12, and the y position of the tip end portion of the reference mark 19=y1R when the heightwise position Z of the tip end portion of the capillary 24 is Z1 are shown. In this manner, the relation between the heightwise position Z of the tip end portion of the capillary 24 and the y position of each component on the imaging plane 34 is shown. In a similar manner, it is possible to create a diagram showing the x position along a vertical axis and the heightwise position Z of the tip end portion of the capillary 24 along a horizontal axis in the two-dimensional coordinate to show the relation between the heightwise position Z of the tip end portion of the capillary 24 and the x position of each component on the imaging plane 34.

Referring back to FIG. 3, after S16, the heightwise position Z of the tip end portion of the capillary 24 is moved downward from the first height Z1 to a second height Z2 (S18), and the position of the capillary 25 and the position of the virtual image 61 on the imaging plane 34 are calculated (S20). This process is the same as the process in S14 and S16, other than that the heightwise position Z of the capillary 24 is moved from Z1 to Z2. FIGS. 5*a*, 5*b*, 5*c* shows diagrams corresponding those of FIGS. 4*a*, 4*b*, 4*c*.

The second heightwise position Z2 is a position lower than Z1, that is, a heightwise position closer to the mirror 16, and may be set to a predetermined heightwise position within the range in which the capillary 24 is not brought into contact with the mirror 16. For example, it is possible to set such that Z2=100 μm, where Z1=200 μm.

FIGS. 5*a*, 5*b*, 5*c*(a) is a diagram showing an optical path of light from the capillary 24, the virtual image 60 of the capillary, and the reference mark 18 are directed to the diagonal optical system 30 when the heightwise position Z of the capillary 24 is Z2. As a content of FIGS. 5*a*, 5*b*, 5*c*(a) is the same as FIG. 4*a*, its detailed description is omitted.

FIGS. 5*a*, 5*b*, 5*c*(b) shows the diagram corresponding that of FIG. 4*b*, and is a diagram showing the imaging plane 34 of the diagonal optical system 30 when the heightwise position Z of the capillary 24 is Z2. FIGS. 5*a*, 5*b*, 5*c*(b) shows a position A21 (x21, y21) of the tip end portion of the capillary 25, a position A22 (x22, y22) of the tip end portion of the capillary in the virtual image 61, and a position A2R (x2R, y2R) of the tip end portion of the reference mark 19 that are calculated based the capillary 25, the virtual image 61, and the reference mark 19 shown on the imaging plane 34.

FIGS. 5*a*, 5*b*, 5*c*(c) shows the diagram corresponding that of FIG. 4*c*, showing the relation between the heightwise position Z of the tip end portion of the capillary 24 and the y position of each component on the imaging plane 34. Here, the y position of the tip end portion of the capillary 25=y21, the y position of the tip end portion of the capillary in the virtual image 61=y22, and the y position of the tip end portion of the reference mark 19=y2R when the heightwise position Z of the tip end portion of the capillary 24 is Z2 are shown.

S14, S16, S18, and S20 are executed by a function of the imaging processor 50 for tool and its image of the control unit 40.

Referring back to FIG. 3, calculation of the position of the landing point is performed next (S22). The processing procedure is executed by a function of the landing position calculation processor 52 of the control unit 40. The position of the landing point is calculated based on the positional data for the four positions A11, A12, A21, and A22 calculated in S16 and S20, as well as on the first heightwise position Z1 and the second heightwise position Z2.

FIG. 6 is a diagram combining the contents of FIG. 4c and FIGS. 5a, 5b, 5c(c). A horizontal axis shows the heightwise position Z of the tip end portion of the capillary 24, and a vertical axis shows the y position. A line connecting y11 and y21 indicates a change in the y position of the tip end portion of the capillary 24 when the heightwise position Z of the capillary 24 changes from Z1 to Z2, and a line connecting y12 and y22 indicates a change in the y position of the tip end portion of the capillary in the virtual image 61 when the heightwise position Z of the capillary 24 changes from Z1 to Z2.

An interval between the two lines along the y direction decreases as the heightwise position Z of the capillary 24 comes closer to the surface of the mirror 16. In other words, as the heightwise position Z of the capillary 24 comes closer to the surface of the mirror 16, the tip end portion of the capillary 25 and the tip end portion of the capillary in the virtual image 61 come closer to each other. At the landing point, the tip end portion of the capillary 25 and the tip end portion of the capillary in the virtual image 61 should be brought into contact with each other. Therefore, calculating a position of an intersection P between the line connecting y11 and y21 and the line connecting y12 and y22 results in an estimated position of the y position at the landing point. In this manner, calculation of the y position at the landing point is performed.

Here, while a line connecting y1R and y2R indicates a change in the position of the reference mark 19 when the heightwise position Z of the capillary 24 changes from Z1 to Z2, the change is almost negligibly small. This is because the reference mark 18 is engraved in the surface of the mirror 16 and not related to the downward movement of the capillary 24.

As illustrated in FIG. 6, when a difference between the y position of the intersection P as the position of the landing point and the y position of the reference mark 19 is Δy, Δy indicates an error in the calibration process of the offset interval D0 performed in S10 and S12. Specifically, as an estimated contact position when the capillary 24 is brought into contact with the mirror 16 when the capillary 24 moves downward based on the calibration process of the offset interval D0 is the position of the reference mark 18, Δy indicates an amount of change in the offset in the bonding generated based on the error in the calibration process of the offset interval D0. Similarly, it is possible to obtain Δx, which is an error in the calibration process of the offset interval D0 for the x direction may be obtained.

Referring back to FIG. 3, as the position of the landing point is obtained, the difference Δy between the obtained position and the position of the reference mark 18 is fed back and the offset movement is corrected. The bonding process is performed based on the correction. Specifically, in the bonding process, the XY stage 15 is driven and moved to perform positioning of a central coordinate of the view field of the positioning camera 26 to a position on the bonding target 8 at which the bonding is desired. Then, the bonding head 20 moves by the offset interval D0, and at this position, the capillary 24 is moved downward. This is the same as the offset movement in S12. In the offset movement in the bonding process, the difference Δy is fed back and the amount of movement is corrected to (D0+Δy). With this, in the bonding process, it is possible to have the capillary 24 make landing at a position on the bonding target at which the bonding is desired. When Δx is obtained, Δx may be fed back, and the bonding head 20 may be moved by Δx to correct the movement.

Figure 7:
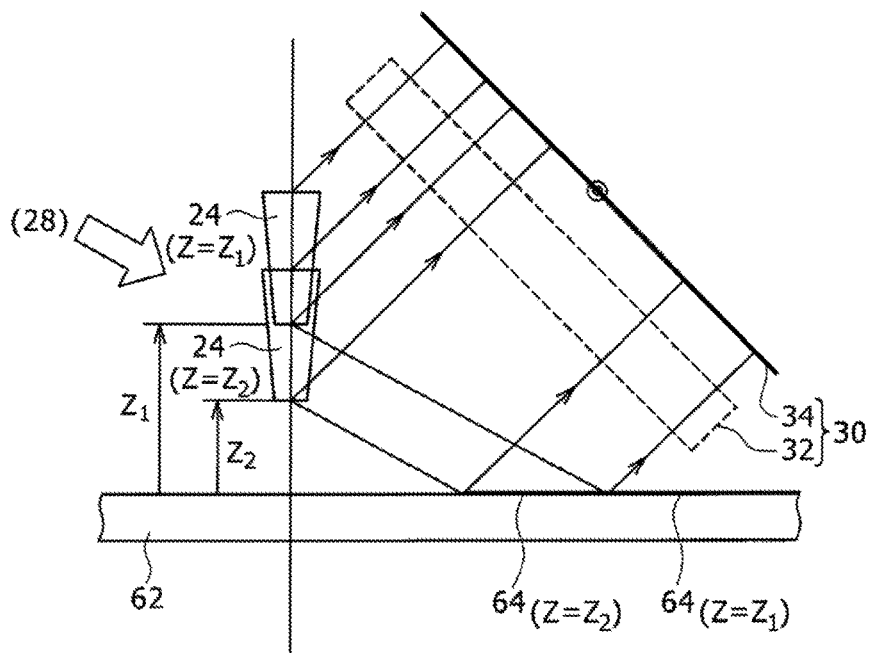
FIG. 7 is a diagram illustrating an example in which a diffuser plate is used instead of the mirror in the bonding apparatus of the embodiment according to the present invention.
Figure 8:
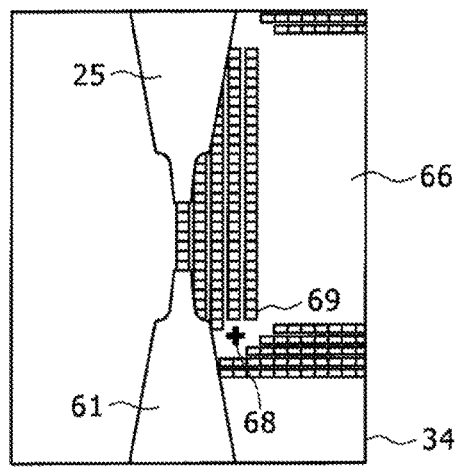
FIG. 8 is a diagram illustrating an example in which the landing point of the capillary is estimated using a mirror plane on a surface of the bonding target in the bonding apparatus of the embodiment according to the present invention.

In the above description, the virtual image 60 of the capillary 24 reflected on the mirror 16 is used. FIGS. 7 and 8 are diagrams illustrating examples not using the virtual image 60 of the capillary 24 reflected on the mirror 16.

FIG. 7 shows the diagram illustrating an example using a shadow image 64 of the capillary 24 when the lighting apparatus 28 is lit up, instead of using the virtual image 60 of the capillary 24. FIG. 7 is a diagram corresponding to those of FIG. 4a and FIGS. 5a, 5b, 5c(a), showing the states, in an overlapping manner, in which the heightwise position Z of the tip end portion of the capillary 24 is Z1 and Z2.

Here, while the mirror 16 may be used as it is, a planar body that is suited to receive the shadow image of the capillary 24 may also be used. For example, it is possible to use the diffuser plate 62 having a surface with a diffusing plane of suitable coarseness, instead of a mirror plane, that does not make regular reflection according to the law of reflection but produces scattering or diffusion according to the coarseness. The diffuser plate 62 is provided, in place of the mirror 16, on a top surface of the transfer rail 14 of the bonding stage 13. As the diffuser plate 62, a common planar plate having the reference mark 18 may be used.

The diagonal optical system 30 takes an image of the capillary 24 and the shadow image 64 on the diffuser plate 62 via the telecentric optical system 32 using an imaging camera 31. The imaging plane 34 that has been taken is similar to those shown in FIG. 4b and FIGS. 5a, 5b, 5c(b). In this case, too, as the capillary 24 comes closer to the top surface of the diffuser plate 62, the position of the tip end portion of the capillary 25 and a position of a tip end portion of the shadow image 64 of the capillary on the imaging plane 34 gradually come closer to each other. The estimation of the position of the landing point may be performed based on the two heightwise positions and the four coordinate positions obtained on the imaging plane 34.

When the bonding target has a characteristic pattern on a surface in a mirror or diffusing plane, it is possible to have the bonding target receive the shadow image of the capillary 24. Examples of such a bonding target include a semiconductor device and a film substrate. FIG. 8 shows the imaging plane 34 of the diagonal optical system 30 when the shadow image 64 of the capillary 24 is received on a surface in a mirror or diffusing plane of a semiconductor device 66. Here, the lighting apparatus 28 is lit up, and the shadow image 64 of the capillary 24 is received on the semiconductor device 66. As the reference mark 18, a positioning pattern 68 on the semiconductor device 66 may be used. Instead of the positioning pattern 68A, a characteristic pattern such as a pad 69 on the semiconductor device 66 may be used as the reference mark 18.

As described above, when the bonding target has a surface in a mirror or diffusing plane and a characteristic pattern, taking an image of the characteristic pattern using the diagonal optical system 30 eliminates the necessity of a special reference member, and the necessity of positioning of the positioning camera 26 to the special reference member may also be eliminated.

In the above description, it is assumed that the bonding apparatus 10 is a wire bonding apparatus, and the bonding tool is the capillary 24. However, the bonding apparatus may be a die bonding apparatus or a flip-chip mounting apparatus, and the bonding tool may be a die bonding tool or a flip-chip tool.

Figure 9A:
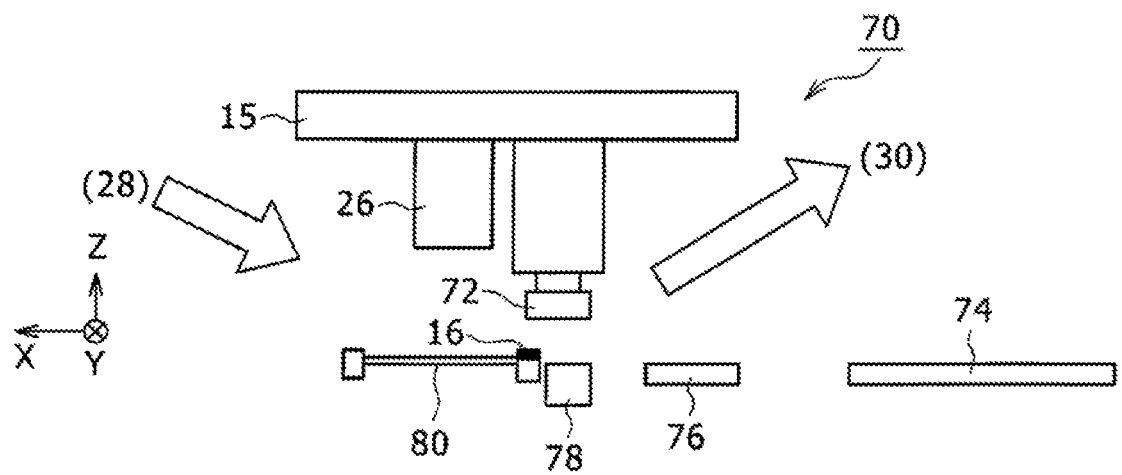
FIG. 9a, 9b show diagrams illustrating an example in which the landing point of the capillary is estimated where the bonding apparatus is a flip-chip mounting apparatus.
Figure 9B:
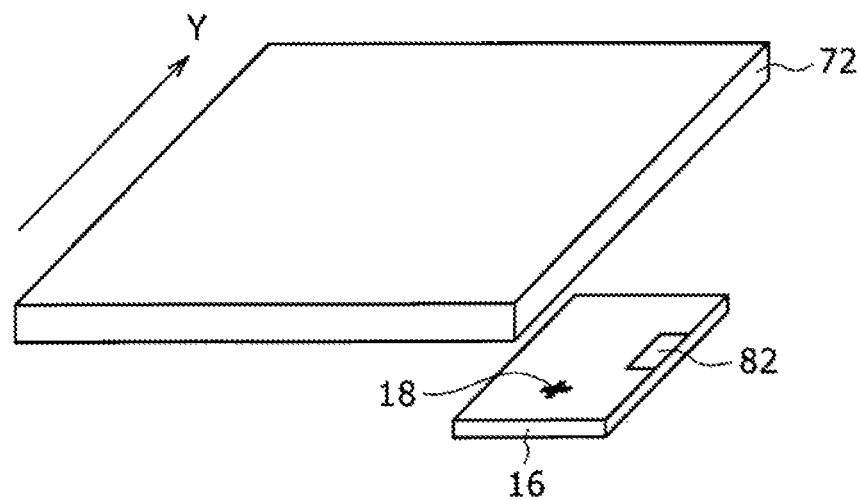

FIGS. 9a, 9b show diagrams illustrating an arrangement relation of the components when the estimation of the position of the landing point is performed using a diagonal optical system 30 in a flip-chip mounting apparatus 70. FIG. 9(a) is a diagram showing the flip-chip mounting apparatus 70 having an intermediate stage 76 in the XZ plane, and FIG. 9(b) is a diagram showing an arrangement of a flip-chip tool 72 and the mirror 16. The diffuser plate 62 or the like may be used in place of the mirror 16.

The flip-chip mounting apparatus 70 picks up a chip with a single bump from a wafer 74 on which bumps are formed, transfers the chip to the intermediate stage 76, and flips the chip so that a surface on which the bump is formed faces down. The chip with a bump in this state is held by the flip-chip tool 72, positioning to a pad on a substrate 80 is performed using a rear camera 78, and then the flip-chip tool 72 is moved down to perform mounting. Here, the estimation of the position of the landing point of the flip-chip tool 72 may be performed using the reference mark 18 and the diagonal optical system 30.

As illustrated in FIG. 9(b), the mirror 16 is disposed in front of the substrate 80 and reflects a shadow image 82 of the flip-chip tool 72 thereon, which shadow image is observed along with the flip-chip tool 72 using the diagonal optical system 30. A procedure of the estimation of the position of the landing point is the same as that described with reference to FIG. 2 through FIG. 6.

Figure 10A:
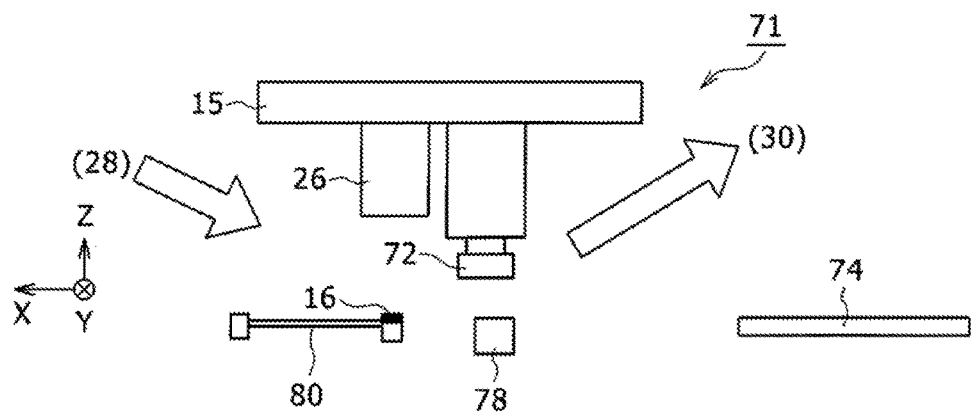
FIG. 10a, 10b show diagrams illustrating an example in which the landing point of the capillary is estimated where the bonding apparatus is a die bonding apparatus.
Figure 10B:
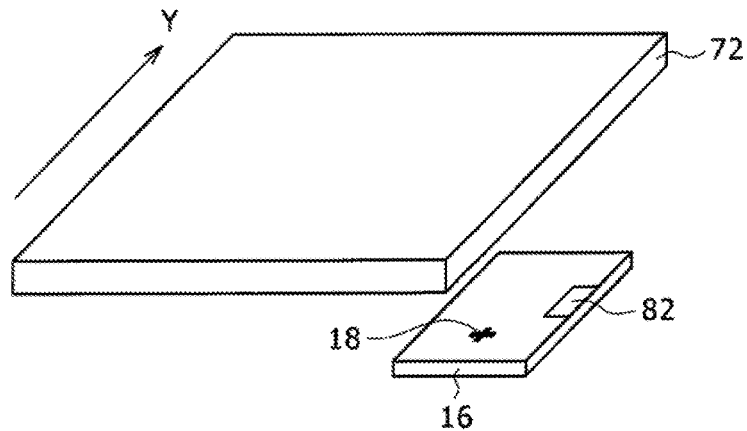

FIG. 10 shows diagrams illustrating an arrangement relation of the components when the estimation of the position of the landing point is performed using a diagonal optical system 30 in a die bonding apparatus 71. FIG. 10 (a) is the same as FIG. 9 (a) other than that the intermediate stage 76 illustrated in FIG. 9 (a) is not provided. FIG. 10 (b) is a diagram showing an arrangement of a tool for die bonding apparatus 72 that is the same as the flip-chip tool 72 and the mirror 16. The diffuser plate 62 or the like may be used in place of the mirror 16.

In the meantime, when the diagonal optical system 30 is used, optical lengths from the capillary 24, the virtual image 60 in the mirror 16, and the shadow image 64 in the diffuser plate 62 as imaging targets to the imaging plane 34 are different from each other. Therefore, while magnitudes of objects as imaging targets and an image projected on the imaging plane 34 are made constant using the telecentric optical system 32, if the objects as imaging targets are largely displaced form the depth of field, the projected image becomes blurry to a large extent. A method that allows suppression of blurring on the imaging plane 34 due to a difference between the optical lengths will be described with reference to FIG. 11 through FIG. 13.

Figure 11:
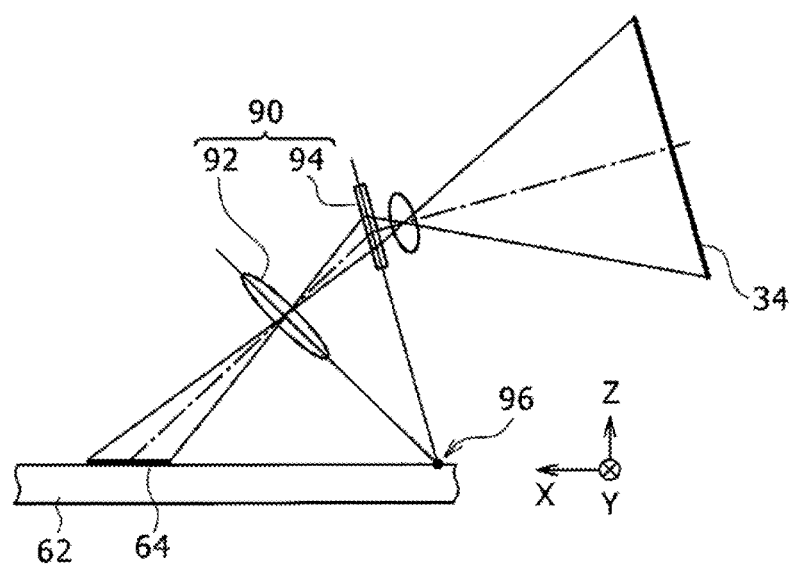
FIG. 11 is a diagram illustrating a different embodiment.

FIG. 11 is a diagram illustrating a diagonal optical system employing a first optical system 90 satisfying a condition of the Scheimpflug principle. The Scheimpflug principle is such that when an image forming plane and a main surface of a lens intersects with one straight line, an object on which a focus is placed also intersects with the same straight line. In the example shown in FIG. 11, the shadow image 64 of the capillary 24 extending in the X direction on the diffuser plate 62 is shown as an example of the object having a different optical length from the imaging plane 34. Therefore, an object on which focus is to be placed is the diffuser plate 62 on which the shadow image 64 of the capillary 24 is reflected. The Scheimpflug condition for placing focus on the shadow image 64 as a whole is that a surface of the diffuser plate 62, a main surface of a lens 92, and an image forming plane 94 by the lens 92 intersect with a single straight line 96.

Therefore, by arranging the image forming plane 94 of the lens 92 in the following manner, the shadow image 64 as a whole on the surface of the diffuser plate 62 may be focused on the image forming plane 94. Specifically, the image forming plane 94 is disposed such that the straight line 96 by which the image forming plane 94 of the lens 92 intersects with the diffuser plate 62 coincides with the straight line 96 by which the surface of the diffuser plate 62 intersects with the main surface of the lens 92.

As an image projected on the image forming plane 94 is focused without blurring, an image of the image forming plane 94 is taken via the telecentric optical system 32 and shown on the imaging plane 34. As illustrated in FIG. 11, a common optical system may be used in place of the telecentric optical system 32.

As the image forming plane 94, a transmissive screen, a fiber optical plate, an image conduit, or the like may be used so that an image may be taken from a side opposite on which the first optical system 90 is disposed.

Figure 12:
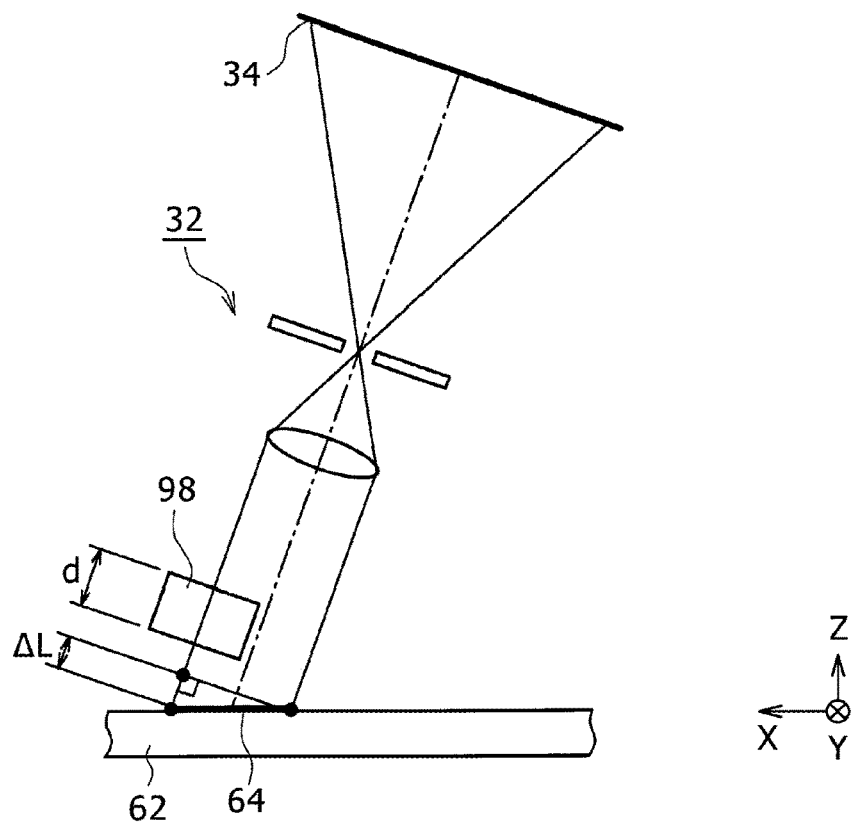
FIG. 12 is a diagram illustrating a different embodiment.

FIG. 12 is a diagram illustrating an example in which a difference between the optical lengths from the imaging plane 34 is compensated using an optical length compensation element. Similarly to FIG. 11, in FIG. 12, the shadow image 64 of the capillary 24 extending in the X direction on the diffuser plate 62 is shown as an example of the object having a different optical length from the imaging plane 34. In this example, a parallel planar plate glass 98 as an optical length compensation element is disposed at a position at which the optical length becomes longer. An optical length compensation element other than the parallel planar plate glass 98 may also be provided.

Where a thickness of the parallel planar plate glass 98 is d, and a refractive index of the parallel planar plate glass 98 is n, a focus position may be compensated by $\Delta L=d\{1-(1/n)\}$. As one example, $\Delta L=0.34$ mm, where d=1 mm and n=1.52. In this case, while a distance that can be compensated is not large, it is possible to make the optical length closer to the focus position.

Figure 13:
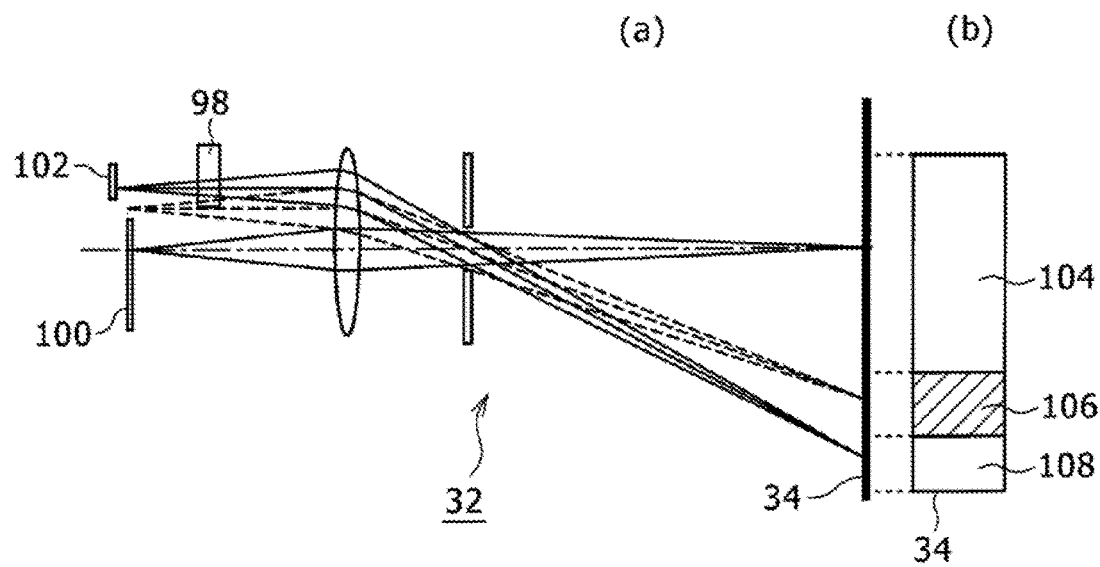
FIG. 13 shows detailed diagrams illustrating an action of FIG. 12.

FIG. 13 shows detailed diagrams illustrating the action illustrated in FIG. 12 in a generalized manner. FIG. 13(a) is a diagram illustrating a relation of the optical paths, and FIG. 13 (b) is a diagram showing a focused area and blurred and unfocused areas on the imaging plane 34 as distinguished from each other. Here, two objects 100 and 102 having different optical lengths to the imaging plane 34 are shown. When the telecentric optical system 32 is used, the object 100 that is positioned at an appropriate distance from the imaging plane 34 is focused. In the imaging plane 34, this position is included in a focused area 104. The object 102 that is more distant from the imaging plane 34 than the object 100 is not focused. In the imaging plane 34, areas 106 and 108 outside the area 104 are unfocused areas.

Here, providing the parallel planar plate glass 98 for compensation of the optical length between the object 102 and the telecentric optical system 32 changes the area 108 to a focused area on the imaging plane 34. The area 106 remains as an unfocused area. By using the parallel planar plate glass 98 of an appropriate shape, it is also possible to change the area 108 to a focused area. As described above, using the parallel planar plate glass 98 for compensation of the optical length decreases an unfocused area on the imaging plane 34 of the diagonal optical system 30.

The present invention is not limited to the embodiment described above, and includes any alteration and modification without departing from the technical scope and the spirit of the present invention as defined in the appended claims.

REFERENCE SIGNS LIST

8: Bonding target
10: (Wire bonding) Apparatus
11: Apparatus main body
12: Mounting table
13: Bonding stage
14: Transfer rail
15: XY stage
16: Mirror
17: Linear motor
18: Reference mark (reference pattern as reference for positioning)
19: Reference mark (on imaging plane)
20: Bonding head
21: Bonding arm
22: Transducer
24: Capillary
25: Capillary (on imaging plane)
26: Positioning camera
28: Lighting apparatus
30: Diagonal optical system
32: Telecentric optical system
32a: Lens
32b: Diaphragm
32c: Object plane
34: Imaging plane
40: Control unit
42: Bonding processor
44: Tool landing position estimating unit
46: Offset movement processor
48: Tool-height change processor
50: Imaging processor for tool and its image
52: Landing position calculation processor
60: (Capillary'S) Virtual image
61: Capillary virtual image (on imaging plane)
62: Diffuser plate
64: (Capillary'S) Shadow image
66: Semiconductor device
68: Positioning pattern
69: Pad
70: Flip-chip mounting apparatus
71: Die bonding apparatus
72: Flip-chip tool (tool for die bonding apparatus)
74: Wafer
76: Intermediate stage
78: Rear camera
80: Substrate
82: (Flip-chip tool's) Shadow image
90: First optical system
92: Lens
94: Image forming plane
96: Straight line
98: Parallel planar plate glass
100, 102: Object
104, 106, 108: Area

The invention claimed is:

1. A bonding apparatus, comprising:
a bonding tool attached to a bonding head;
a stage configured to move the bonding head slidably in an XY direction;
a Z-movement mechanism configured to move the bonding tool freely in a Z direction perpendicular to an XY plane;
a bonding stage for holding a bonding target;
a rail disposed under the bonding tool and adjacent to the bonding stage
wherein an edge of the rail is parallel and perpendicular to an edge of the bonding stage;
a mirror coupled to a top surface of the rail,
wherein a top surface of the mirror is parallel to a top surface of the bonding target, and
wherein the top surface of the mirror comprises a reference mark;
a diagonal optical system having an imaging camera configured to observe the bonding tool and the mirror from an obliquely upward position,
wherein the imaging camera is located a fixed offset distance from the bonding tool, and
wherein the imaging camera is fixed at a predetermined angle toward a tip end portion of the bonding tool for simultaneously imaging the reference mark, the tip end portion, and a reflection of the tip end portion in the mirror;
the bonding apparatus performs bonding on the bonding target by:
detecting the position of the reference mark;
performing offset movement of the bonding tool in a direction of the mirror;
moving the bonding tool to a first height above the mirror;
detecting a first position of the tip end portion and a second position of an image of the tip end portion in the mirror using the imaging camera;
moving the bonding tool to a second height above the mirror,
wherein the first height is greater than the second height;
detecting a third position of the tip end portion and a fourth position of an image of the tip end portion in the mirror using the imaging camera; and
estimating a position of a landing point based on the detected first position, second position, third position, and fourth position.

2. The bonding apparatus according to claim 1, wherein a control unit estimates the position of the landing point.

3. The bonding apparatus according to claim 1, wherein the bonding tool is one of a capillary that performs a wire bonding process, a tool that performs a die bonding process, and a tool that performs a flip-chip mounting process.

4. The bonding apparatus according to claim 1, wherein the diagonal optical system adjusts an optical length of one of the tip end portion of the bonding tool and the tip end portion of the bonding tool in the image received on the mirror so that the optical length becomes identical with an optical length of the other.

5. The bonding apparatus according to claim 2, wherein the control unit detects a change in a bonding offset generated during bonding based on a difference between a position of the reference mark and the estimated position of the landing point.

6. The bonding apparatus according to claim 1, wherein the control unit performs bonding by feeding back the detected change in the bonding offset.

* * * * *